(12) United States Patent
Terada et al.

(10) Patent No.: US 7,753,253 B2
(45) Date of Patent: Jul. 13, 2010

(54) DISPENSING DEVICE AND MOUNTING SYSTEM

(75) Inventors: Katsumi Terada, Shiga (JP); Takashi Takei, Shiga (JP)

(73) Assignee: Toray Engineering Co., Ltd., Tokyo (JP)

( * ) Notice: Subject to any disclaimer, the term of this patent is extended or adjusted under 35 U.S.C. 154(b) by 101 days.

(21) Appl. No.: 11/594,766

(22) Filed: Nov. 9, 2006

(65) Prior Publication Data

US 2007/0111400 A1    May 17, 2007

(30) Foreign Application Priority Data

Nov. 15, 2005    (JP)    ............................. 2005-330094

(51) Int. Cl.
  *B29C 31/00*    (2006.01)
  *H01L 23/29*    (2006.01)
  *B23K 1/012*    (2006.01)

(52) U.S. Cl. .................. 228/123.1; 228/179.1; 228/229; 228/230; 118/683; 118/684; 222/380

(58) Field of Classification Search .............. 228/123.1, 228/179.1, 229, 230; 118/683–684; 222/380
See application file for complete search history.

(56) References Cited

U.S. PATENT DOCUMENTS 6,046,076 A * 4/2000 Mitchell et al. ............. 438/127
6,284,173 B1 * 9/2001 Austin et al. ................ 264/102
6,453,548 B1 * 9/2002 Hidese ........................ 29/832
6,511,301 B1 * 1/2003 Fugere ........................ 417/359
2001/0025873 A1 * 10/2001 Tanaka et al. ........... 228/180.21
2001/0035572 A1 * 11/2001 Isaak ........................... 257/678
2003/0102297 A1 * 6/2003 Goenka et al. .............. 219/400

FOREIGN PATENT DOCUMENTS

EP    869554 A2 * 10/1998

\* cited by examiner

*Primary Examiner*—Jessica L Ward
*Assistant Examiner*—Erin B Saad
(74) *Attorney, Agent, or Firm*—Smith Patent Office (57) ABSTRACT

A dispensing device (4) for charging underfill agent into a gap between a substrate (K) and a chip (C) includes means for storing underfill agent (66, 67), a chamber (52) provided for containing substrate (K) to be charged with underfill agent and capable of being opened/closed, a dispenser (73) provided in the chamber (52) and discharging underfill agent introduced from the storing means (66, 67) into the gap between the substrate (K) and the chip (C), and a first pressure reducing means (46) for reducing the pressure in the chamber (52) at a predetermined vacuum pressure prior to the discharge of underfill agent by the dispenser (73). The dispensing device (4) can supply underfill agent with no bubbles to the substrate (K). A mounting system using this dispensing device (4) is also provided by the invention.

3 Claims, 7 Drawing Sheets

DISPENSING DEVICE AND MOUNTING SYSTEM

BACKGROUND OF THE INVENTION

1. Field of the Invention

The present invention relates to a dispensing device and a mounting system. More specifically, the present invention relates to a dispensing device which can charge underfill agent at a desirable form when the underfill agent is charged into a gap between a substrate and a chip, and a mounting system using the dispensing device.

2. Description of Prior Art

Figure 7:
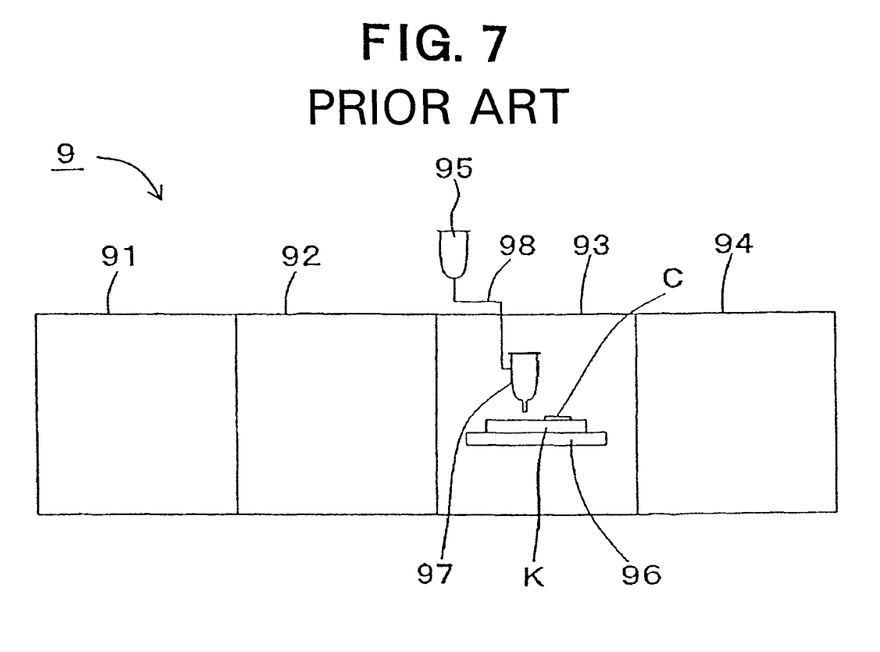
FIG. 7 is a schematic elevational view of a conventional mounting system.

FIG. 7 shows a conventional mounting system 9. This mounting system 9 has a substrate loader 91, a chip mounting device 92, a dispensing device 93 and a substrate unloader 94 (for example, Japanese Patent Application No. 2005-102746). Dispensing device 93 comprises a storing means 95 for storing underfill agent, a stage 96 for placing and holding a substrate K thereon, a dispenser 97 for charging underfill agent into a gap between the substrate K and a chip C, and a tube 98 connecting between storing means 95 and dispenser 98.

In such a mounting system 9, substrate K supplied from substrate loader 91 to chip mounting device 92 is sent to dispensing device 93 after being mounted with chip C and pressed by a bonding head provided in the chip mounting device 92. In dispensing device 93, underfill agent is charged into a gap between substrate K and chip C by dispenser 97, and the charged underfill agent is cured at a predetermined temperature for a predetermined time by a curing furnace (not shown). By this, the bonding strength between substrate K and chip C can be increased, and an electrical coupling part therebetween can be sealed from outside. The substrate K supplied with underfill agent is taken out from substrate unloader 94 in order at a condition where the underfill agent is not cured completely.

In such a conventional dispensing device 93, there may be a problem that under fill agent involves bubbles in its inside, when the underfill agent is supplied from storing means 95 to dispenser 97 through tube 98 or when the underfill agent is charged into a gap between substrate K and chip C. By using the underfill agent containing bubbles, or by evaporation of moisture absorbed by substrate K, bubbles (gas) remain in the underfill agent when the underfill agent is cured, the bonding strength between substrate K and chip C may be decreased, or electrodes provided to the substrate K and chip C may be oxidized.

SUMMARY OF THE INVENTION

Accordingly, it is an object of the present invention to provide a dispensing device which can supply underfill agent containing no bubble to a substrate, and a mounting system using this dispensing device.

To achieve the foregoing and other objects, a dispensing device according to the present invention for charging underfill agent into a gap between a substrate and a chip comprises means for storing underfill agent, a chamber provided for containing a substrate to be charged with underfill agent and capable of being opened/closed, a dispenser provided in the chamber and discharging underfill agent introduced from the storing means into the gap between the substrate and the chip, and a first pressure reducing means for reducing a pressure in the chamber at a predetermined vacuum pressure prior to the discharge of underfill agent by the dispenser.

This dispensing device may further comprises a tube connecting between the storing means and the dispenser, and a second pressure reducing means for reducing a pressure in the tube at a predetermined vacuum pressure prior to introduction of underfill agent from the storing means to the dispenser through the tube. This second pressure reducing means may be provided separately from the first pressure reducing means, or the first and second pressure reducing means may be formed as a same pressure reducing means.

Further, in the dispensing device according to the present invention, a structure may be employed wherein the storing means comprises a first storing means and a second storing means, and the first and second storing means are provided so as to be selectively communicated with the dispenser.

A mounting system according to the present invention comprises a chip mounting device for mounting a chip on a substrate and pressing the chip to the substrate, a substrate loader for carrying the substrate into the chip mounting device, a dispensing device formed as described above, and a substrate unloader for carrying a substrate charged with underfill agent in the dispensing device out of the dispensing device.

In this mounting system, a structure may be employed wherein each of the substrate loader and the substrate unloader has an oven capable of heat reserving the substrate together with a substrate magazine, each of the chip mounting device and the dispensing device has a stage for placing and holding the substrate thereon, and the stage has a heater for heat reserving the substrate at a predetermined temperature.

In such a dispensing device and a mounting system according to the present invention, since the first pressure reducing means reduces the pressure in the chamber at a predetermined vacuum pressure prior to the discharge of underfill agent by the dispenser, bubbles contained in the underfill agent can be removed. Therefore, the dispenser can supply the underfill agent, which does not contain bubbles, to the substrate. Where, there is also a method for charging underfill agent without using a dispenser, for example, a screen printing method. In a case of the screen printing method, a precise positioning between an opening of a screen mask and a chip provided on a substrate is required. In the screen printing method, however, there is a case where positional shift between the substrate and the chip occurs by the distortion, the thermal deformation and the like of the substrate, and there is a case where underfill agent cannot be supplied to a desirable position. From this reason, in the present invention, the charging means is limited to the dispenser. Therefore, differently from the case of employing the screen printing method, there is no problem with respect to the positional shift between the opening of the screen mask and the chip provided on the substrate, and underfill agent can be easily supplied to a desirable position precisely.

Further, by providing the second pressure reducing means, because the second pressure reducing means reduces the pressure in the tube connecting the storing means and the dispenser at a predetermined vacuum pressure prior to introduction of underfill agent from the storing means to the dispenser, the inside of the tube can be filled with underfill agent at a condition without air in the tube, and as a result, it can be prevented that underfill agent involves bubble.

Further, by providing the first and second storing means, which can be selectively communicated with the dispenser, as the storing means, even if underfill agent in the first storing means is exhausted, underfill agent in the second storing means can be supplied successively. Therefore, there is no time loss for supplementing underfill agent.

Furthermore, by providing the oven capable of heat reserving the substrate together with a substrate magazine to each of the substrate loader and the substrate unloader, and providing the stage with a heater to each of the chip mounting device and the dispensing device, substantially over the whole of the mounting process including a series of steps, the substrate can be heat reserved at a predetermined temperature, and therefore, it can be suppressed that the substrate absorbs moisture or the substrate is deformed by a rapid temperature variation.

Further objects, features, and advantages of the present invention will be understood from the following detailed description of preferred embodiments of the present invention with reference to the accompanying figures.

BRIEF DESCRIPTION OF THE DRAWINGS

Embodiments of the invention are now described with reference to the accompanying figures, which are given by way of example only, and are not intended to limit the present invention.

EXPLANATION OF SYMBOLS

1: mounting system
2: substrate loader
3: chip mounting device
4: dispensing device
8: substrate unloader
21: substrate magazine
22: oven
31: movable stage (stage)
46: vacuum pump (first pressure reducing means, second pressure reducing means)
52: main chamber (chamber)
66: first storing means (storing means)
67: second storing means (storing means)
68: tube
71: movable stage (stage)
73: dispenser
81: substrate magazine
82: oven
C: chip
K: substrate

DETAILED DESCRIPTION OF PREFERRED EMBODIMENTS

Figure 1:
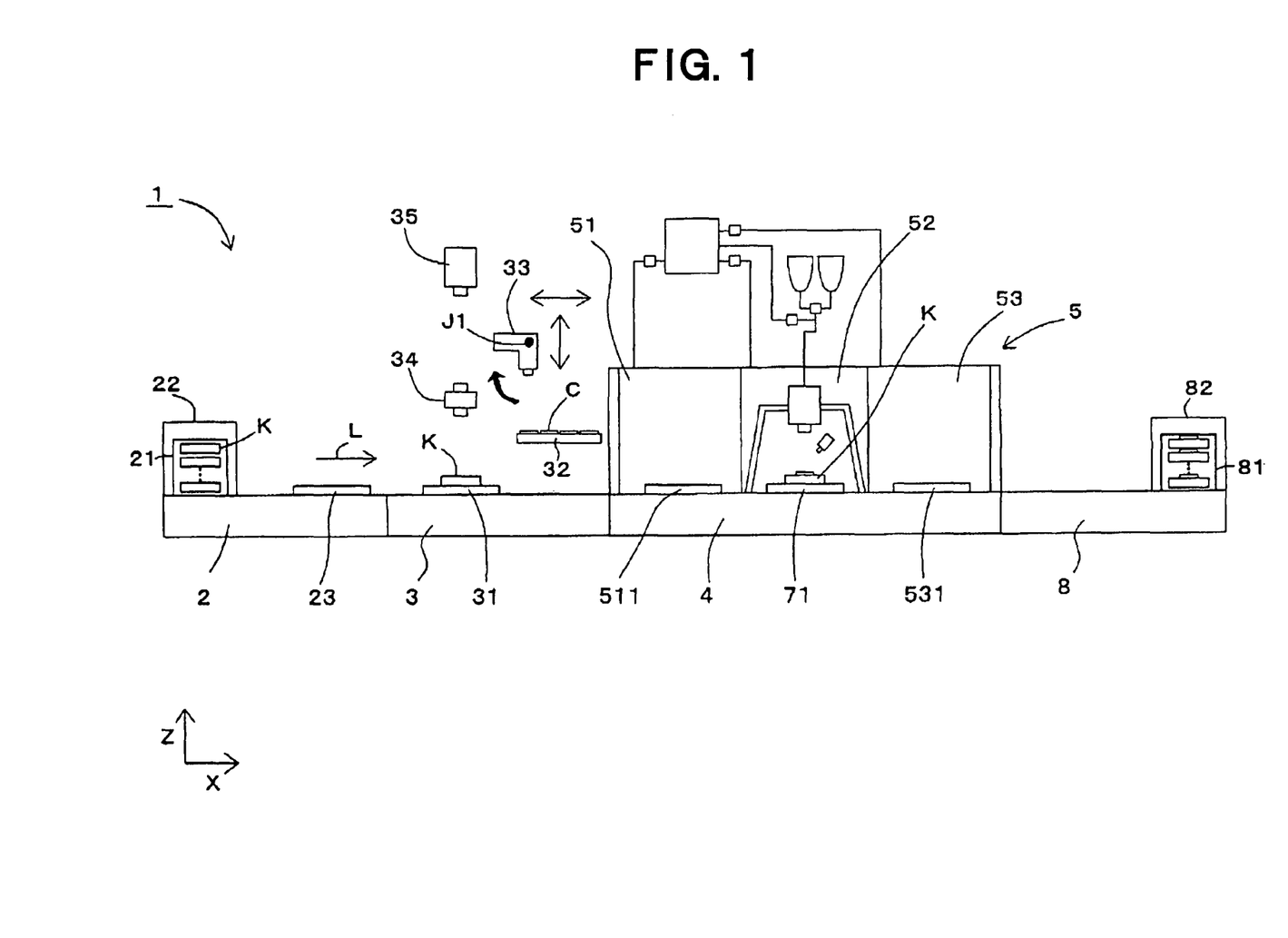
FIG. 1 is a schematic elevational view of a mounting system with a dispensing device according to an embodiment of the present invention.
Figure 2:
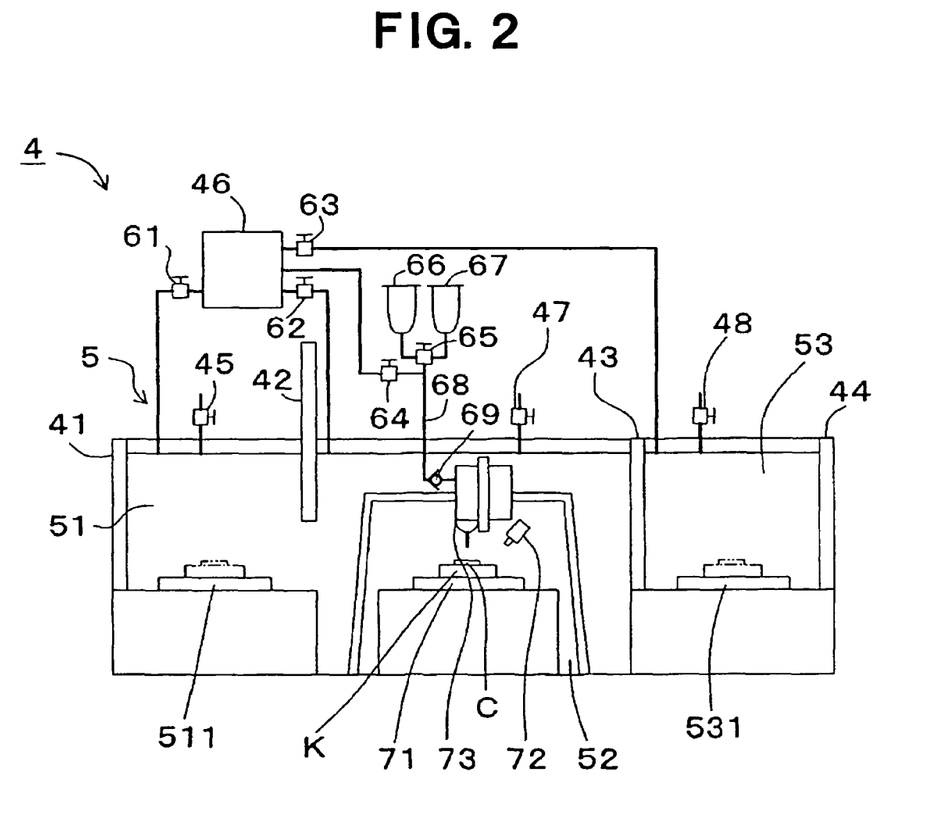
FIG. 2 is an enlarged elevational view of the dispensing device depicted in FIG. 1.
Figure 3:
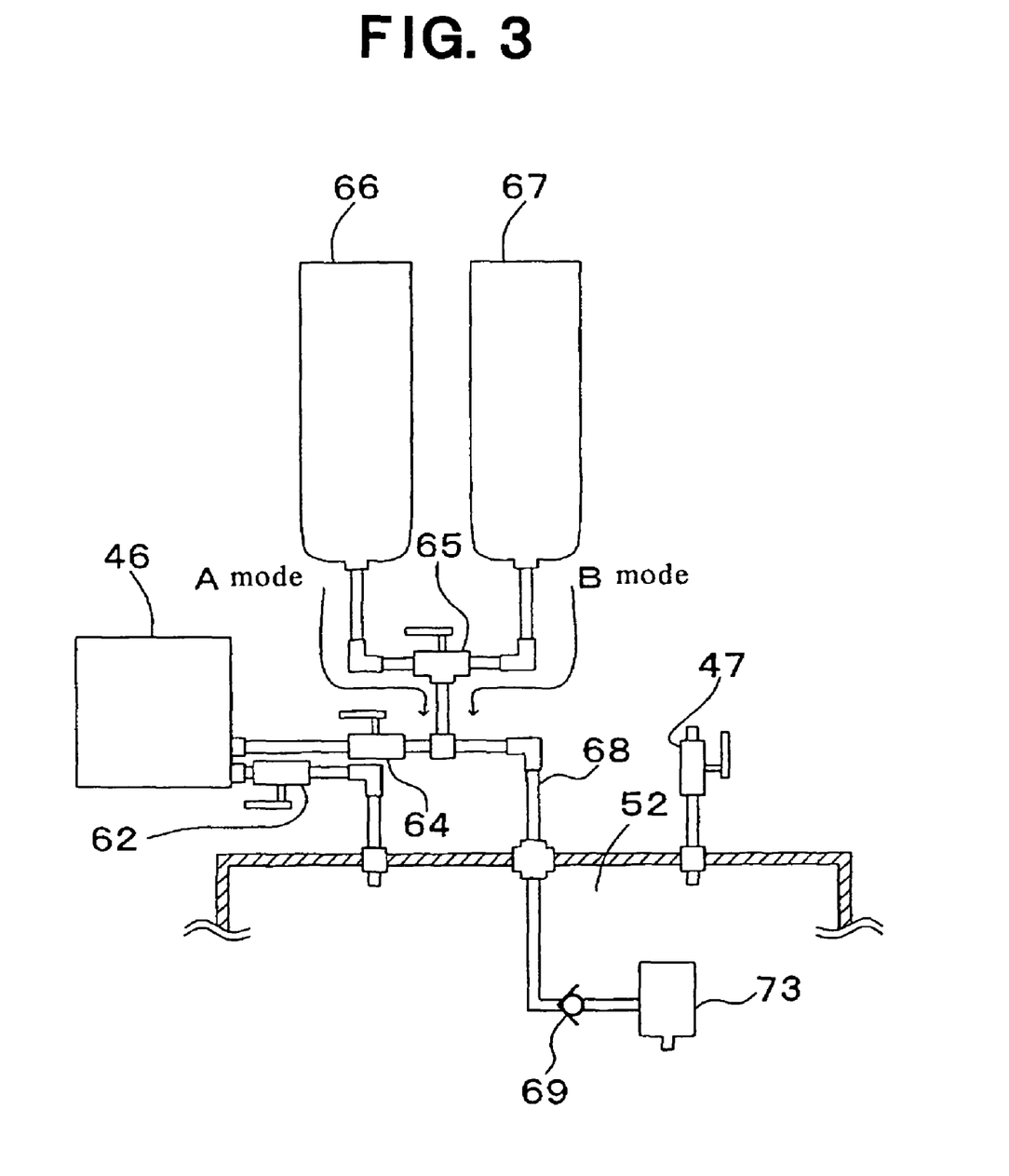
FIG. 3 is an enlarged, partial elevational view of the dispensing device depicted in FIG. 2.

FIG. 1 shows a mounting system with a dispensing device according to an embodiment of the present invention, FIG. 2 shows an enlarged elevational view of the dispensing device depicted in FIG. 1, and FIG. 3 shows an enlarged, partial elevational view of the dispensing device depicted in FIG. 2. In the respective figures, three axes X, Y and Z of orthogonal coordinate system are employed, the lateral direction is referred to as X-axis direction, the direction perpendicular to the paper surface is referred to as Y-axis direction, the vertical direction is referred to as Z-axis direction, and the rotational direction around the Z-axis is referred to as θ direction, respectively.

As shown in FIG. 1, a mounting system 1 has a structure in which a substrate loader 2, a chip mounting device 3, a dispensing device 4 and a substrate unloader 8 are disposed in this order. Although not shown, on a part from substrate loader 2 to substrate unloader 8, a substrate carrying means for carrying a substrate K along a carrying route L is provided. This substrate carrying means is formed, for example, by a robot for holding substrate K and having an extensible arm or a rail member with rollers structured so as to be able to carry substrate K.

Substrate loader 2 is a device for supplying substrate K in order to chip mounting device 3, and it has an oven 22 for heat reserving substrate K together with substrate magazine 21 capable of containing a plurality of substrates K, and a waiting stage 23 for making substrate K wait. In waiting stage 23, a heater (not shown) is embedded for heat reserving substrate K.

Chip mounting device 3 is a device for mounting chip C onto substrate K supplied from substrate loader 2, and it has a movable stage 31 which holds substrate K a predetermined position and which can be moved in the respective directions X, Y and θ, a chip stocker 32 which stocks chip C to be mounted at a condition where the bump forming surface of the chip C is directed upward, a chip turning-over part 33 which takes out chip C from chip stocker 32 by vacuum adsorption and which turns over the chip C so that the bump forming surface thereof is directed downward, a two-sight camera 34 which can take the positional information of chip C located at an upper position and substrate K located at a lower position simultaneously, and a bonding head 35 which holds the non-bump forming surface of chip C turned over by the chip turning-over part 33 by vacuum adsorption and which mounts the chip C onto substrate K and presses it. In movable stage 31, a heater (not shown) is embedded for heating and heat reserving substrate K.

Dispensing device 4 is a device for charging underfill agent into a gap between substrate K and chip C, and as shown in FIG. 2, dispensing device 4 has a front chamber 51 which can be closed at a sealed condition by closing a first gate 41 and a second gate 42, a main chamber 52 which can be closed at a sealed condition by closing the second gate 42 and a third gate 43, and a rear chamber 53 which can be closed at a sealed condition by closing the third gate 43 and a fourth gate 44.

Front chamber 51 has a first release valve 45 and is connected to a vacuum pump 46 via a tube and a first opening/closing valve 61. In front chamber 51, a waiting stage 511 is provided for making substrate K wait which is mounted with chip C and served to charge of underfill agent. In waiting stage 511, a heater (not shown) is embedded for heat reserving substrate K.

Main chamber 52 has a second release valve 47 and is connected to a vacuum pump 46 via a tube and a second opening/closing valve 62. In main chamber 52, provided are a movable stage 71 (embedded with a heater) for holding substrate K to be charged with underfill agent (that is, substrate K mounted with chip C) and capable of being driven in the respective directions X, Y and θ, a camera 72 capable of obtaining a positional information of substrate K, and a dispenser 73 with a discharge nozzle for discharging underfill agent and capable of being driven in Z direction. Dispenser 73 is connected to first storing means 66 and second storing means 67 via a tube 68 and a three-way valve 65. First storing means 66 and second storing means 67 are structured, for example, as syringe containers each capable of storing a predetermined amount of underfill agent, respectively. Further, dispenser 73 is connected to vacuum pump 46 via a check valve 69 and a fourth opening/closing valve 64.

Three-way valve 65 can be switched between the following A mode and B mode. Namely, as shown in FIG. 3, in A mode, only first storing means 66 communicates with dispenser 73. In B mode, only second storing means 67 communicates with dispenser 73. In C mode, any of between first storing means 66 and dispenser 73, between second storing means 67 and dispenser 73 and between first storing means 66 and second storing means 67 is not communicated.

Rear chamber 53 has a third release valve 48 and is connected to vacuum pump 46 via a tube and a third opening/closing valve 63. In rear chamber 53, a waiting stage 531 is provided for making substrate K wait which is charged with underfill agent. In waiting stage 531, a heater (not shown) is embedded for heat reserving substrate K.

The opening/closing valves and the like to be operated or driven among the respective elements in the above-described mounting system 1 are controlled by a controller (not shown).

Figure 4:
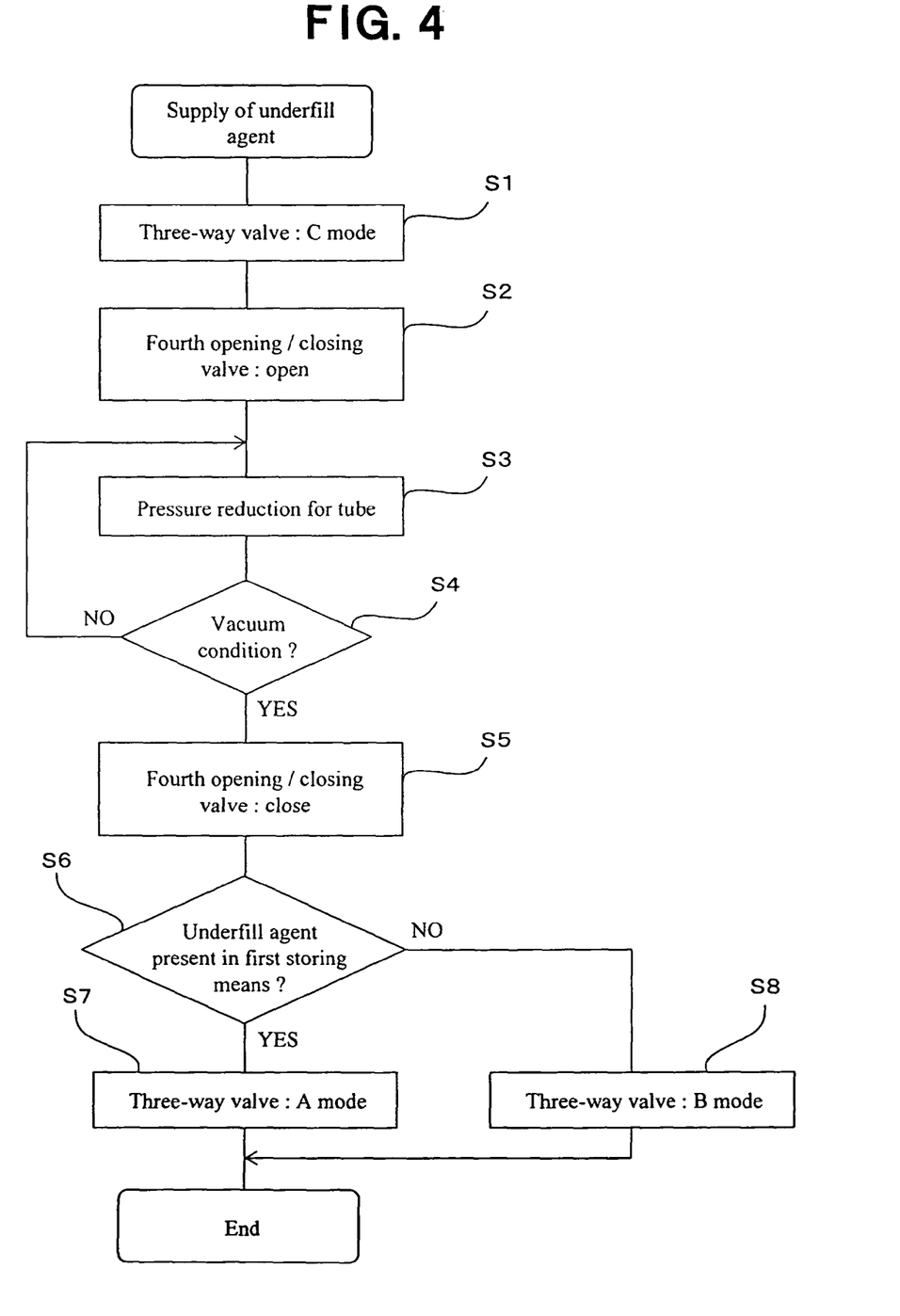
FIG. 4 is a flowchart showing an example of an operation for supplying underfill agent to a dispenser in the dispensing device depicted in FIG. 2.
Figure 5:
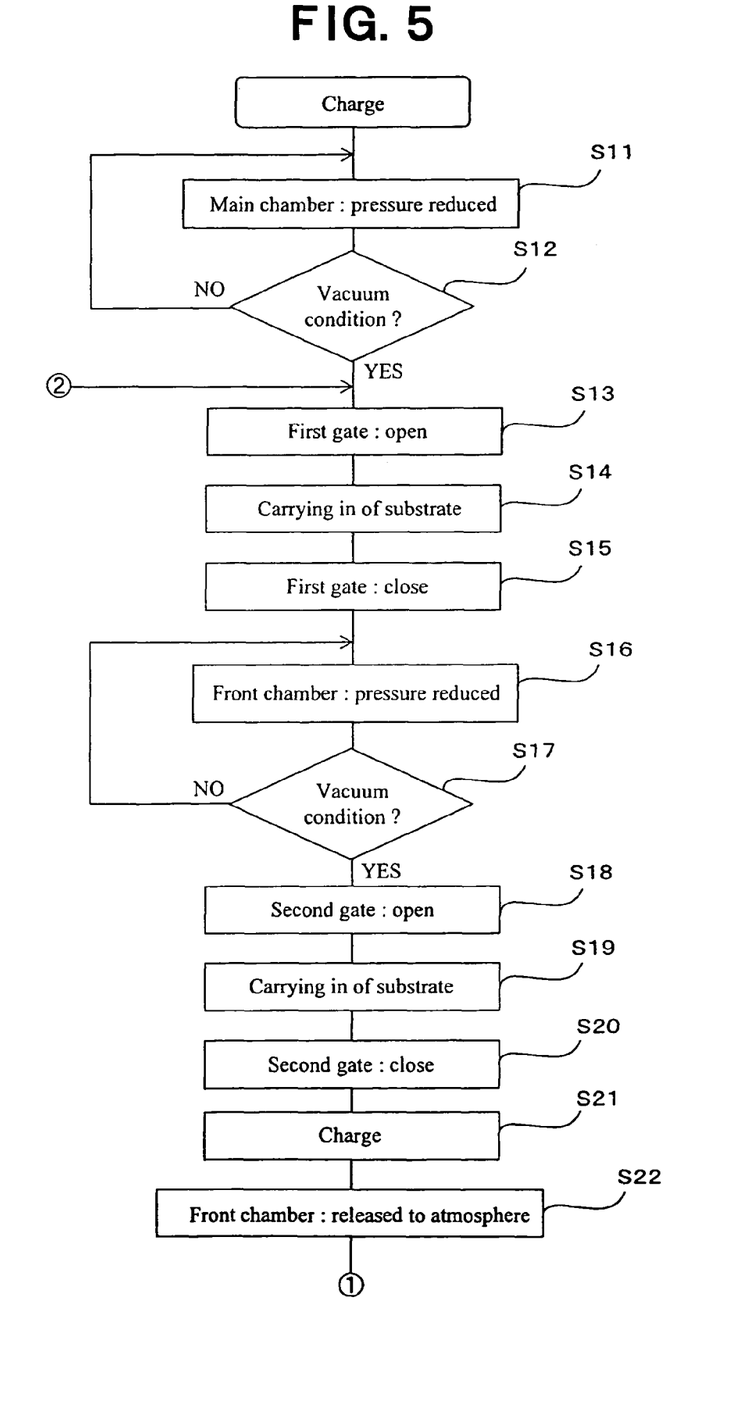
FIG. 5 is a flowchart showing an example of an operation for charging underfill agent to a substrate in the dispensing device depicted in FIG. 2 (first half).
Figure 6:
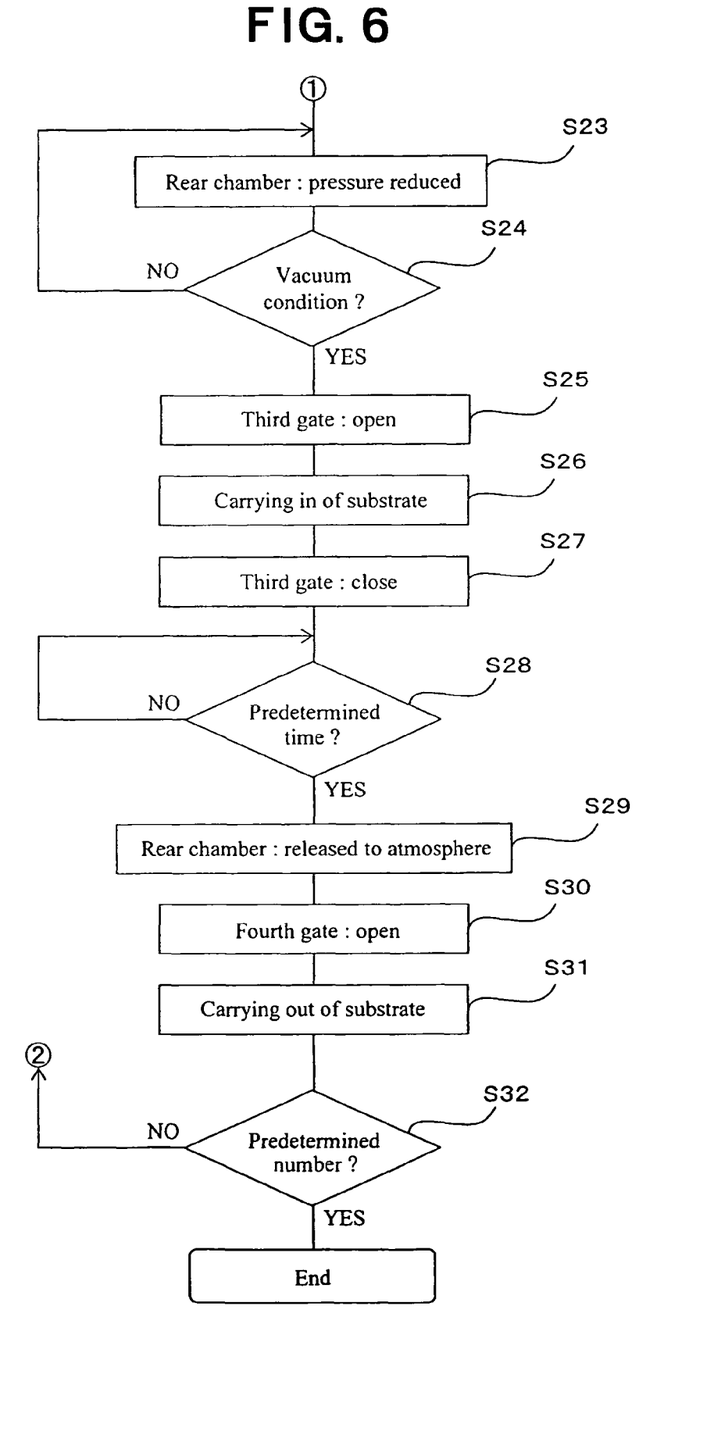
FIG. 6 is a flowchart showing an example of an operation for charging underfill agent to the substrate in the dispensing device depicted in FIG. 2 (second half).

Next, referring to FIGS. 4-6, the operation of the mounting system thus constructed will be explained. FIG. 4 shows a flowchart showing the operation for supplying underfill agent to the dispenser, and FIGS. 5 and 6 show flowcharts showing the operation for charging underfill agent to the substrate.

Where, the operation will be explained based on the premise that the initial condition of dispensing device 4 is as follows. Namely, first gate 41, second gate 42, third gate 43 and fourth gate 44 are closed. First and third opening/closing valves 61 and 63 are both closed, and second opening/closing valve 62 is opened. First and third release valves 45 and 48 are both opened, and second release valve 47 is closed. Therefore, front and rear chambers 51 and 53 are both at an atmospheric pressure, and main chamber 52 is controlled at a predetermined vacuum pressure of about 20 to about 10000 Pa (a condition of "YES" at step 12 in FIG. 5). Further, a sufficient amount of underfill agent is stored in each of first and second storing means 66 and 67, three-way valve 65 is controlled at C mode, and fourth opening/closing valve 64 is closed.

First, as shown in FIG. 4, prior to the mounting operation, an operation for supplying underfill agent to dispenser 73 is carried out in dispensing device 4. Because three-way valve is in C mode, the inside of tube 68 is controlled at a closed and sealed condition (step S1). Therefore, dispenser 73 does not communicate with both first and second storing means 66 and 67, and underfill agent is not introduced into dispenser 73. At this condition, fourth opening/closing valve 64 is opened (step S2), and the inside of tube 68 is reduced in pressure (step S3). When the pressure in main chamber 52 is reduced at a pressure of a predetermined vacuum pressure or lower ("YES" at step S4), fourth opening/closing valve 64 is closed (step S5).

Succeedingly, after it is confirmed that a sufficient amount of underfill agent is present in first storing means 66 ("YES" at step S6), three-way valve 65 is switched to A mode (step S7). In A mode, because first storing means 66 and dispenser 73 are communicated with each other, underfill agent stored in first storing means 66 is sent into dispenser 73 through tube 68. Because the inside of tube 68 is maintained at a vacuum pressure, it can be prevented that the underfill agent sent to dispenser 73 involves bubbles in the tube 68. Where, in a case where a sufficient amount of underfill agent is not stored in first storing means 66 ("NO" at step S6), three-way valve 65 is switched to B mode, and underfill agent is supplied from second storing means 67 (step S8).

Next, the mounting operation is carried out. The respective substrates K stocked in substrate magazine 21 are controlled at a constant temperature in oven 22. The substrate carrying means supplies the respective substrates K stocked in substrate magazine 21 to chip mounting device 3 one by one through waiting stage 23.

In chip mounting device 3, chip turning-over part 33 is driven in the directions X, Y and Z, and it takes out chip C from chip stocker 32 stocking chips C by adsorbing the bump forming surface of the chip C at vacuum. Thereafter, by rotating chip turning-over part 33 around a horizontal axis J1, the chip C is turned over so that the bump forming surface is directed downward. Bonding head 35 is driven in the directions X, Y and Z, and it takes out the turned-over chip C from chip turning-over part 33 by adsorbing the chip C at vacuum. Then, two-sight camera 34 reads the positions of chip C and substrate K, and based on the read information, movable stage 31 is moved in the directions X, Y and θ, thereby positioning between the chip C and the substrate K (alignment). Thereafter, bonding head 35 is driven downwardly in Z direction, and the bonding head 35 mounts the chip C held by vacuum adsorption onto substrate K at its mounting position and heats and presses the chip C.

The substrate K mounted with chip C in chip mounting device 3 is carried into front chamber 51 as follows. Namely, as shown in FIGS. 5 and 6, in dispensing device 4, after it is confirmed that main chamber 52 is controlled at a predetermined pressure-reduced condition (steps S11 and S12), first gate 41 of front chamber 51 is opened (step S13), and substrate K is carried into front chamber 51 by substrate carrying means and placed and held on waiting stage 511 (step S14). After substrate K is carried into front chamber 51, first gate 41 is closed (step S15), and thereafter, first opening/closing valve 61 is opened and front chamber 51 is reduced in pressure (step S16). When the pressure in front chamber 51 reaches a vacuum pressure of about 20 to about 10000 Pa ("YES" at step S17), first opening/closing valve 61 is closed and second gate 42 is opened (step S18), and substrate K is carried into main chamber 52 by substrate carrying means and placed and held on movable stage 71 (step S19). After substrate K is carried into main chamber 52, second gate 42 is closed (step S20).

Thereafter, the charging operation of underfill agent is carried out as follows (step S21). Namely, the position of the chip on substrate K is read by camera 72, and based on the chip position, the alignment is carried out by driving movable stage 71 in the respective directions X, Y and θ so that dispenser 73 can charge underfill agent to an optimum charging position. After this alignment, dispenser 73 is driven downwardly in Z direction, its nozzle discharges underfill agent, and the underfill agent is charged into a gap between substrate K and chip C. When the charging operation is completed, dispenser 73 returns to its original position upwardly in Z direction.

In dispensing device 4, the alignment is carried out so that dispenser 73 can charge underfill agent to an optimum charging position base on the chip position on substrate K read by camera 72. Therefore, differently from the case using the screen printing method, there is no problem as to the positional shift between the opening of a screen mask and chip C on substrate K, the underfill agent can be supplied to a desirable position. Further, as the positional information of chip C on substrate K, the position to be charged may be based on the positional information read by two-sight camera 34 of chip mounting device 3. In this case, it is not necessary to carry out the alignment in dispensing device 4, and the time required for alignment may be shortened.

Thus, in dispensing device 4, since vacuum pump 46 reduces in pressure the inside of tube 68 connecting between storing means 66 and dispenser 73 prior to introduction of underfill agent from storing means 66 to dispenser 73 (step S7, step S3), the inside of tube 68 can be filled with underfill agent at a condition where staying air does not exist in the tube 68, and as a result, it can be prevented that underfill agent involves bubbles. Further, since vacuum pump 46 reduces in pressure the inside of main chamber 52 prior to the discharge operation of underfill agent by dispenser 73 (step 21, step S16, step S17), even if bubbles are involved in underfill agent, they are removed. Therefore, dispenser 73 can supply underfill agent, which does not contain bubbles, to substrate K.

In main chamber 52, during the charge of underfill agent to substrate K, first release valve 45 is opened and front chamber 51 is returned to a condition at an atmospheric pressure (step S22), and thereafter, first gate 41 is opened, and a next new substrate K is carried into front chamber 51. Further, third gate 63 is opened, and rear chamber 53 is reduced in pressure (step S23).

When the charging operation is completed and the pressure in rear chamber 53 reaches about 20 to about 10000 Pa ("YES" at step S 24), third opening/closing valve 63 is closed and third gate 43 is opened (step S25), and substrate K charged with underfill agent is carried into rear chamber 53 by substrate carrying means and placed and held on waiting stage 531 (step S26). After substrate K is carried into rear chamber 53, third gate 43 is closed (step S27). Thereafter, substrate K is left in rear chamber 53 at a vacuum condition for a predetermined time. By this, penetration of underfill agent into the gap between substrate K and chip C can be accelerated, and the time required for the penetration can be shortened. When a predetermined time expires ("YES" at step S28), third release valve 48 is opened, and rear chamber 53 is returned to a condition at an atmospheric pressure (step S29). Succeedingly, fourth gate 44 is opened (step S30), and substrate K is carried out (step S31).

After third gate 43 is closed, first gate 41 is opened and a new substrate K is introduced into front chamber 51, and the charging operation of underfill agent to the new substrate K is repeated similarly to the above-described manner (step S32). Namely, during the charging operation of underfill agent, the operation for carrying substrate K from chip mounting device 3 into front chamber 51, the treatment for penetrating underfill agent to substrate K by pressure reduction in rear chamber 53, and the operation for carrying substrate K to substrate unloader 8, are carried out. Thus, since main chamber 52 is maintained at the closed condition and the pressure therein is maintained at a vacuum pressure even during substrate K is carried from and to outside, it is not necessary to return the pressure in main chamber 52 to an atmospheric pressure at each time when substrate K is carried into the main chamber 52 and carried out from the main chamber 52, and therefore, the tact time can be improved.

In the above-described mounting operation, the heaters of ovens 22 and 82, waiting stages 23, 511 and 531 and movable stages 31 and 71 are controlled so that substrate K is heat reserved at 80 to 120° C. By this, substantially over the whole of the mounting process having a series of steps, substrate K is heat reserved at a predetermined temperature, and therefore, it can be suppressed that substrate K absorbs moisture or deforms accompanying with a rapid temperature variation.

In the above-described embodiment, although dispensing device 4 is structured as a so-called load-lock type one which has front and rear chambers 51 and 53 capable of being reduced in pressure before and after main chamber 52, it is possible to form a dispensing device having only a main chamber. In such a case, the cost of the device can be saved by the amount of not providing front and rear chambers 51 and 53. Further, it is also possible to provide main chamber 52 and rear chamber 53 without providing front chamber 51. In this case, the time required for the above-described penetration can be shortened.

Further, instead of three-way valve 65, an opening/closing valve may be provided for each of first storing means 66 and second storing means 67. In this case, it may be performed that, first, fourth opening/closing valve 64 is opened, after tube 68 is reduced in pressure, both of the two opening/closing valves provided instead of three-way valve 65 are opened and underfill agent is charged into the tube 68, thereafter, any one of the two opening/closing valves is closed, and underfill agent is supplied. By such a manner, air present in a tube between first storing means 66 and second storing means 67 can be prevented from being involved.

Furthermore, a structure can also be employed wherein another vacuum pump different from vacuum pump 46 is provided for increasing the vacuum degrees of first storing means 66 and second storing means 67, and air can be prevented from being involved into underfill agent before the underfill agent is supplied.

Although embodiments of the present invention have been described in detail herein, the scope of the invention is not limited thereto. It will be appreciated by those skilled in the art that various modifications may be made without departing from the scope of the invention. Accordingly, the embodiments disclosed herein are only exemplary. It is to be understood that the scope of the invention is not to be limited thereby, but is to be determined by the claims which follow.

What is claimed is:

1. A dispensing device for charging underfill agent into a gap between a substrate and a chip comprising:
   a storing unit for storing underfill agent;
   a chamber provided for containing a substrate to be charged with underfill agent and capable of being opened/closed;
   a dispenser provided in said chamber and discharging underfill agent introduced from said storing unit into said gap between said substrate and said chip;
   a pressure reducing unit connected directly to said chamber by a first passage containing a valve, said first pressure reducing unit reducing a pressure in said chamber at a predetermined vacuum pressure to make underfill agent without bubbles, prior to said discharge of underfill agent by said dispenser; and
   a tube between said storing unit and said dispenser, and
   wherein said pressure reducing unit is connected directly to said tube by a second passage containing a valve, for reducing a pressure in said tube at a predetermined vacuum pressure prior to introduction of underfill agent from said storing unit to said dispenser through said tube;
   wherein said storing unit comprises a first storing unit, a second storing unit and a three-way valve, and said first and second storing units are provided so as to be selectively communicated with said dispenser via said three-way valve; and wherein said three-way valve includes a first mode, a second mode and a third mode so that said first storing unit only communicates with said dispenser in said first mode; said second storing unit only communicates with said dispenser in said second mode; and said first storing unit, said second storing unit and said dispenser are disconnected from each other in said third mode.

2. A mounting system comprising:

a chip mounting device for mounting a chip on a substrate and pressing said chip to said substrate;

a substrate loader for carrying said substrate into said chip mounting device;

a dispensing device for charging underfill agent into a gap between said substrate and said chip; and a substrate unloader for carrying a substrate charged with underfill agent in said dispensing device out of said dispensing device;

wherein said dispensing device comprises a storing unit for storing underfill agent;

a chamber provided for containing said substrate to be charged with underfill agent and capable of being opened/closed;

a dispenser provided in said chamber and discharging underfill agent introduced from said storing unit into said gap between said substrate and said chip;

a pressure reducing unit connected directly to said chamber by a first passage containing a valve, said first pressure reducing unit reducing a pressure in said chamber at a predetermined vacuum pressure to make underfill agent without bubbles, prior to said discharge of underfill agent by said dispenser;

a tube between said storing unit and said dispenser, and wherein said pressure reducing unit is connected directly to said tube by a second passage containing a valve, for reducing a pressure in said tube at a predetermined vacuum pressure prior to introduction of underfill agent from said storing unit to said dispenser through said tube;

wherein said storing unit comprises a first storing unit, a second storing unit and a three-way valve, and said first and second storing units are provided so as to be selectively communicated with said dispenser via said three-way valve; and wherein said three-way valve includes a first mode, a second mode and a third mode so that said first storing unit only communicates with said dispenser in said first mode; said second storing unit only communicates with said dispenser in said second mode; and said first storing unit, said second storing unit and said dispenser are disconnected from each other in said third mode.

3. The mounting system according to claim 2, wherein each of said substrate loader and said substrate unloader has an oven capable of heat reserving said substrate together with a substrate magazine, each of said chip mounting device and said dispensing device has a stage for placing and holding said substrate thereon, and said stage has a heater for heat reserving said substrate at a predetermined temperature.

* * * * *